US009466342B2

(12) United States Patent
Miyano

(10) Patent No.: US 9,466,342 B2
(45) Date of Patent: Oct. 11, 2016

(54) TRANSISTORS WITH SOURCE AND WORD LINE VOLTAGE ADJUSTING CIRCUITRY FOR CONTROLLING LEAKAGE CURRENTS AND ITS METHOD THEREOF

(71) Applicant: Kabushiki Kaisha Toshiba, Minato-ku, Tokyo (JP)

(72) Inventor: Shinji Miyano, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/593,395

(22) Filed: Jan. 9, 2015

(65) Prior Publication Data

US 2016/0071579 A1 Mar. 10, 2016

(30) Foreign Application Priority Data

Sep. 4, 2014 (JP) ................................. 2014-180010

(51) Int. Cl.
| | |
|---|---|
| *G11C 11/00* | (2006.01) |
| *G11C 7/10* | (2006.01) |
| *G11C 5/14* | (2006.01) |
| *G11C 11/4074* | (2006.01) |
| *G11C 11/4091* | (2006.01) |
| *G11C 11/417* | (2006.01) |
| *G11C 8/08* | (2006.01) |
| *G11C 11/418* | (2006.01) |

(52) U.S. Cl.
CPC . *G11C 7/10* (2013.01); *G11C 5/14* (2013.01); *G11C 5/147* (2013.01); *G11C 5/148* (2013.01); *G11C 7/1096* (2013.01); *G11C 8/08* (2013.01); *G11C 11/4074* (2013.01); *G11C 11/4091* (2013.01); *G11C 11/417* (2013.01); *G11C 11/418* (2013.01)

(58) Field of Classification Search
CPC . G11C 11/4125; G11C 11/41; G11C 11/417; G11C 11/413; G11C 5/14; G11C 5/147
USPC .................. 365/154, 156, 222, 203, 230.06, 365/189.16, 190, 226, 227
See application file for complete search history.

(56) References Cited

U.S. PATENT DOCUMENTS

| | | | | |
|---|---|---|---|---|
| 4,023,149 A | * | 5/1977 | Bormann | ............ G11C 11/4023 327/208 |
| 5,583,821 A | * | 12/1996 | Rose | ..................... G11C 11/418 365/149 |

(Continued)

OTHER PUBLICATIONS

Walker et al., "Four-transistor static CMOS memory cells," in Electron Devices Meeting, 1977 International , vol. 23, No., pp. 402-405, 1977.*

(Continued)

*Primary Examiner* — Gene Auduong
(74) *Attorney, Agent, or Firm* — Knobbe, Martens, Olson & Bear, LLP

(57) ABSTRACT

According to one embodiment, a semiconductor memory device includes a source voltage adjustment circuit and a word line voltage adjustment circuit, which are configured to respectively supply a source voltage supply end and a word line switchingly with voltage-adjusted voltages, in response to a mode switching signal for switching between a retention state mode and an active state mode, wherein the source voltage supply end is connected to sources of MOS transistors forming a flip-flop of a memory cell, and the word line is connected to gates of access transistors.

15 Claims, 6 Drawing Sheets

(56) References Cited

U.S. PATENT DOCUMENTS

| | | | |
|---|---|---|---|
| 6,751,111 B2* | 6/2004 | Foss | G11C 11/412 257/E27.099 |
| 6,920,061 B2* | 7/2005 | Bhavnagarwala | G11C 11/412 365/154 |
| 7,200,030 B2* | 4/2007 | Yamaoka | G11C 11/417 365/154 |
| 7,492,625 B2* | 2/2009 | Joo | G11C 11/412 365/154 |
| 2002/0105825 A1* | 8/2002 | Marshall | G11C 11/412 365/154 |
| 2008/0056049 A1* | 3/2008 | Moyer | G11C 5/147 365/227 |
| 2008/0219069 A1* | 9/2008 | Arsovski | G11C 29/50 365/201 |
| 2011/0299326 A1* | 12/2011 | Saripalli | G11C 11/412 365/156 |
| 2013/0170287 A1* | 7/2013 | Walsh | G11C 11/417 365/154 |
| 2014/0036612 A1* | 2/2014 | Rai | G11C 11/417 365/227 |

OTHER PUBLICATIONS

Noda et al., "A Loadless CMOS Four-Transistor SRAM Cell in a 0.18μm Logic Technology," in Electron Devices, IEEE Transactions on, vol. 48, No. 12, pp. 2851-2855, Dec. 2001.*

Koichi Takeda et al., "A 16-Mb 400-MHz Loadless CMOS Four-Transistor SRAM Macro", IEEE Journal of Solid-State Circuits, vol. 35(11):1631-1640 (Nov. 2000).

* cited by examiner

TRANSISTORS WITH SOURCE AND WORD LINE VOLTAGE ADJUSTING CIRCUITRY FOR CONTROLLING LEAKAGE CURRENTS AND ITS METHOD THEREOF

CROSS-REFERENCE TO RELATED APPLICATIONS

This application is based upon and claims the benefit of priority from Japanese Patent Application No. 2014-180010, filed on Sep. 4, 2014; the entire contents of which are incorporated herein by reference.

FIELD

Embodiments described herein relate generally to a semiconductor memory device and method of driving the same.

BACKGROUND

Conventionally, there is disclosed an SRAM (Static Random Access Memory) in which each memory cell is composed of four MOS transistors.

The SRAM is a semiconductor memory device that basically does not require a refreshing operation, but maintains a data retention state by leakage currents flowing through each memory cell. If the leakage currents in the data retention state are reduced, it is possible to realize lower power consumption, but it becomes important to control the leakage currents flowing through each memory cell to maintain the data retention state.

DETAILED DESCRIPTION

In general, according to one embodiment, a semiconductor memory device comprises a first MOS transistor including a source, a drain, and a gate, such that its source is connected to a first bit line and its gate is connected to a word line. The device comprises a second MOS transistor including a source, a drain, and a gate, such that its source is connected to a second bit line and its gate is connected to the word line. The device comprises a third MOS transistor including a source, a drain, and a gate, such that its source is connected to a source voltage supply end, its gate is connected to the drain of the second MOS transistor, and its drain is connected to the drain of the first MOS transistor. The device comprises a fourth MOS transistor including a source, a drain, and a gate, such that its source is connected to the source voltage supply end, its gate is connected to the drain of the first MOS transistor, and its drain is connected to the drain of the second MOS transistor. The device comprises a source voltage adjustment circuit configured to supply the source voltage supply end switchingly with a first voltage and a second voltage that has been obtained by adjusting the first voltage by a predetermined voltage, in response to a mode switching signal for switching between a retention state mode where data retention is performed and an active state mode where read or write of data is performed. The device comprises a word line voltage adjustment circuit configured to supply the word line switchingly with application voltages between a third voltage and a fourth voltage that has been obtained by adjusting the third voltage by a predetermined voltage, in response to the mode switching signal.

Exemplary embodiments of a semiconductor memory device and method of driving the same will be explained below in detail with reference to the accompanying drawings. The present invention is not limited to the following embodiments.

First Embodiment

Figure 1:
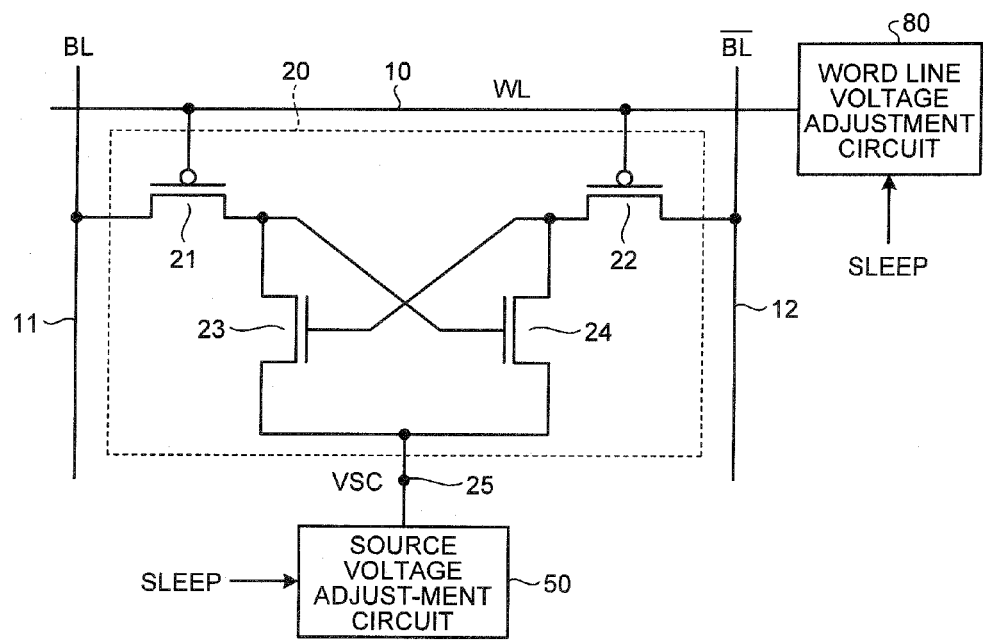
FIG. 1 is a view for explaining a configuration of a semiconductor memory device according to a first embodiment.

FIG. 1 is a view for explaining a configuration of a semiconductor memory device according to a first embodiment. According to this embodiment, the semiconductor memory device comprises memory cells 20, wherein each memory cell 20 is composed of four MOS transistors. The memory cell 20 comprises an NMOS transistor 23 including a source, a drain, and a gate. The source of the NMOS transistor 23 is connected to a source voltage supply end 25. The memory cell 20 comprises an NMOS transistor 24 including a source, a drain, and a gate. The source of the NMOS transistor 24 is connected to the source voltage supply end 25. In other words, the sources of the NMOS transistor 23 and the NMOS transistor 24 are connected in common.

The drain of the NMOS transistor 24 is connected to the gate of the NMOS transistor 23. The gate of the NMOS transistor 24 is connected to the drain of the NMOS transistor 23. The NMOS transistor 23 and the NMOS transistor 24 form a so-called flip-flop circuit. In the data retention state, one of the NMOS transistor 23 and the NMOS transistor 24 is set in the ON-state to retain data, in accordance with data from bit lines (11, 12).

The memory cell 20 comprises a PMOS transistor 21 including a source, a drain, and a gate. The source of the PMOS transistor 21 is connected to the bit line 11, and the drain of the PMOS transistor 21 is connected to the drain of the NMOS transistor 23. The memory cell 20 comprises a PMOS transistor 22 including a source, a drain, and a gate. The source of the PMOS transistor 22 is connected to the bit line 12, and the drain of the PMOS transistor 22 is connected to the drain of the NMOS transistor 24. The gates of the PMOS transistor 21 and the PMOS transistor 22 are connected to a word line 10. Each of the PMOS transistor 21 and the PMOS transistor 22 is called an access transistor.

In the semiconductor memory device according to this embodiment, a source voltage adjustment circuit 50 is connected to the source voltage supply end 25. The source voltage adjustment circuit 50 switches a voltage VSC to be supplied to the source voltage supply end 25, in response to a mode switching signal SLEEP, which switches operation modes of the semiconductor memory device, namely between an active state mode where write or read of data is performed and a retention state mode where neither write nor read of data is performed. As regards the voltage at the source voltage supply end 25, the voltage supplied for the retention state mode is higher by a predetermined voltage than the voltage supplied for the active state mode. For example, in the active state mode, the source voltage supply end 25 is supplied with a ground voltage VSS. In the retention state mode, the source voltage supply end 25 is supplied with a voltage higher, for example by about 0.6V (volt), than the ground voltage VSS.

In the retention state mode, a word line voltage adjustment circuit 80 supplies the word line 10 with a power supply voltage VDD. Since the voltage of the word line WL connected to the gate electrodes of the PMOS transistors (21, 22) is raised to the power supply voltage VDD, the PMOS transistors (21, 22) are set in the OFF-state. In other words, this brings about a state where data retention is achieved by leakage currents from the PMOS transistors (21, 22). In the retention state mode, since the voltage at the source voltage supply end 25 is raised, the voltage difference between the source voltage supply end 25 and each of the bit lines (11, 12) becomes smaller. The source-drain paths of the NMOS transistor 23 and the PMOS transistor 21, which serve as their main current paths, are connected between the source voltage supply end 25 and the bit line 11. On the other hand, the source-drain paths of the NMOS transistor 24 and the PMOS transistor 22, which serve as their main current paths, are connected between the source voltage supply end 25 and the bit line 12. In the retention state mode, since the voltage at the source voltage supply end 25 is raised, both of the gate-source voltage and the source-substrate voltage become negative, whereby the leakage current of each of the MOS transistors is reduced and thus the leakage currents are suppressed in the retention state mode.

In the active state mode, the voltage at the source voltage supply end 25 is lowered to the ground voltage VSS. Consequently, the voltage difference between the source voltage supply end 25 and each of the bit lines (11, 12) is made larger, whereby the source-substrate voltage of each of the MOS transistors is returned to 0, and the gate-source voltage is increased to enhance the drive capability.

For data retention in the memory cell 20, it is configured such that the leakage currents of the PMOS transistors (21, 22) are larger than the leakage currents of the NMOS transistors (23, 24). This is because, if the leakage currents of the NMOS transistors (23, 24) are larger than the leakage currents of the PMOS transistors (21, 22), both of the voltages of the drain electrodes of the NMOS transistors (23, 24) become a Low level and bring about a state where data retention cannot be achieved. In order to design a configuration where the leakage currents of the PMOS transistors (21, 22) are larger than the leakage currents of the NMOS transistors (23, 24), for example, the threshold voltage VTH of each of the PMOS transistors (21, 22) is set smaller than the threshold voltage VTH of each of the NMOS transistors (23, 24). Alternatively, the gate length of each of the PMOS transistors (21, 22) is set smaller than the gate length of each of the NMOS transistors (23, 24). Further, the gate width of each of the PMOS transistors (21, 22) is set larger than the gate width of each of the NMOS transistors (23, 24).

In the semiconductor memory device according to this embodiment, the word line voltage adjustment circuit 80 is connected to the word line 10. When the semiconductor memory device is in the active state mode, the word line voltage adjustment circuit 80 supplies a voltage lower by a predetermined voltage than the power supply voltage VDD, as the voltage of the word line 10. In other words, it supplies a voltage that increases the OFF-state leakage currents of the PMOS transistors (21, 22) connected to the bit lines (11, 12). Since the voltage of the word line 10 connected to the gates of the PMOS transistors (21, 22) is lowered, the OFF-state leakage currents of the PMOS transistors (21, 22) are increased in the non-selected state of the memory cell 20, whereby it is possible to maintain a state where the leakage currents of the PMOS transistors (21, 22) are larger than the leakage currents of the NMOS transistors (23, 24). Consequently, data retention can be achieved in the active state mode without performing a refreshing operation.

In this embodiment, the source voltage adjustment circuit 50 is provided to switch the voltage VSC to be supplied to the source voltage supply end 25, in response to the mode switching signal SLEEP, which switches operation modes of the semiconductor memory device, namely between the active state mode where write or read of data is performed and the retention state mode. In the retention state mode, the voltage VSC at the source voltage supply end 25 is adjusted to reduce the source-drain voltages of the NMOS transistors (23, 24) comprised in the memory cell 20. Consequently, the leakage currents through the memory cell 20 can be suppressed in the retention state mode. In the retention state mode, the PMOS transistors (21, 22) connected to the bit lines (11, 12) are set in the OFF-state, and so data retention in the memory cell 20 is achieved by leakage currents from the PMOS transistors (21, 22). In the retention state mode, since the voltage at the source voltage supply end 25 is raised, both of the gate-source voltage and the source-substrate voltage of each of the NMOS transistors (23, 24) become negative, whereby the leakage currents are reduced and thus the leakage currents can be suppressed. Consequently, it is possible to maintain a state where the leakage currents of the PMOS transistors (21, 22) are larger than the leakage currents of the NMOS transistors (23, 24), so that data retention can be achieved without performing a refreshing operation. Since there is no need to perform a refreshing operation, the power consumption entailed by the refreshing operation can be reduced. Further, since the leakage currents through the memory cell 20 are suppressed in the retention operation mode, the power consumption can be suppressed.

In this embodiment, the word line voltage adjustment circuit 80 is provided to adjust the voltage of the word line WL, in response to the mode switching signal SLEEP, which switches operation modes of the semiconductor memory device, namely between the active state mode where write or read of data is performed and the retention state mode. In the active state mode where write or read of data is performed, the word line voltage adjustment circuit 80 supplies the word line WL with a voltage lower by a predetermined voltage than the power supply voltage VDD. Since the voltage of the word line WL connected to the PMOS transistors (21, 22) is lowered, the OFF-state leakage currents of the PMOS transistors (21, 22) are increased, whereby, when a voltage of a High level is applied to the gates of the PMOS transistors (21, 22), i.e., when the memory cell 20 is set in the non-selected state, the leakage currents of the PMOS transistors (21, 22) become larger. Thus, when the memory cell 20 is set in the non-selected state, it is possible to maintain a state where the leakage currents of the PMOS transistors (21, 22) are larger than the leakage currents of the NMOS transistors (23, 24). Consequently, data retention can be achieved in the active state mode without performing a refreshing operation.

Second Embodiment

Figure 2:
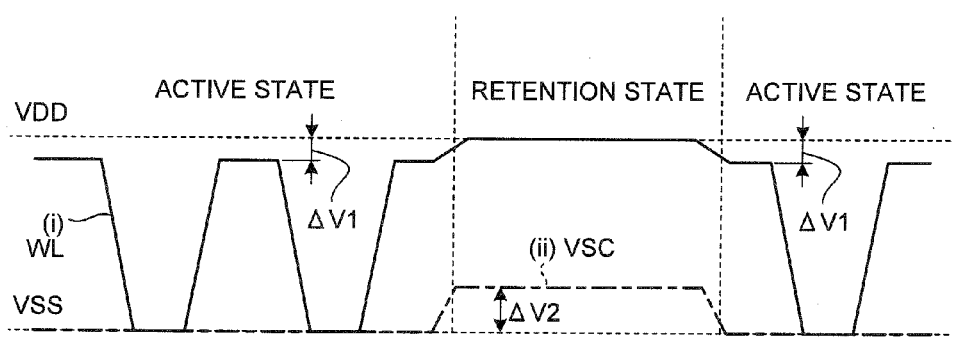
FIG. 2 is a view for explaining a method of driving a semiconductor memory device according to a second embodiment.

FIG. 2 is a view for explaining a method of driving a semiconductor memory device according to a second embodiment. In this embodiment, for example, an explain will be given of a case where each memory cell is formed of the memory cell 20 shown in FIG. 1. In FIG. 2, the solid line (i) denotes the voltage of the word line 10, and the chain line (ii) denotes the voltage at the source voltage supply end 25. In the method of driving a semiconductor memory device according to this embodiment, the voltage of the word line 10 is set at a voltage lower, for example by ΔV1, than the power supply voltage VDD in the active state mode where write or read of data is performed. Since the voltage of the word line 10 to the PMOS transistors (21, 22) is lowered, the OFF-state leakage currents of the PMOS transistors (21, 22) are increased. Consequently, in the active state mode, it is possible to maintain a state where the leakage currents of the PMOS transistors (21, 22) are larger than the leakage currents of the NMOS transistors (23, 24), so that data retention (retention) can be reliably achieved in the active state mode. In the active state mode, when the memory cell 20 is set in the selected state, the word line 10 is supplied with a voltage of a Low level, i.e., the ground voltage VSS, and, when the memory cell 20 is set in the non-selected state, the word line 10 is supplied with a voltage previously mentioned, i.e., a voltage lower by ΔV1 than the power supply voltage VDD.

In the retention state mode, the voltage VSC at the source voltage supply end 25 is raised by ΔV2 from the ground voltage VSS. Thus, both of the gate-source voltage and the source-substrate voltage of each of the NMOS transistors (23, 24) become negative, whereby the leakage currents are reduced and thus the leakage currents are suppressed. Consequently, the leakage currents are suppressed in the retention state mode, and the power consumption can be thereby reduced. Further, in the retention state mode, since the voltage of the word line 10 is raised to the power supply voltage VDD, the PMOS transistors (21, 22) are turned off, whereby the leakage currents of the PMOS transistors (21, 22) are reduced. In the retention state mode, since the voltage VSC at the source voltage supply end 25 is raised to suppress the leakage currents of the NMOS transistors (23, 24), it is possible to maintain a state where the leakage currents of the PMOS transistors (21, 22) are larger than the leakage currents of the NMOS transistors (23, 24), so that data retention can be achieved without performing a refreshing operation.

Figure 3:
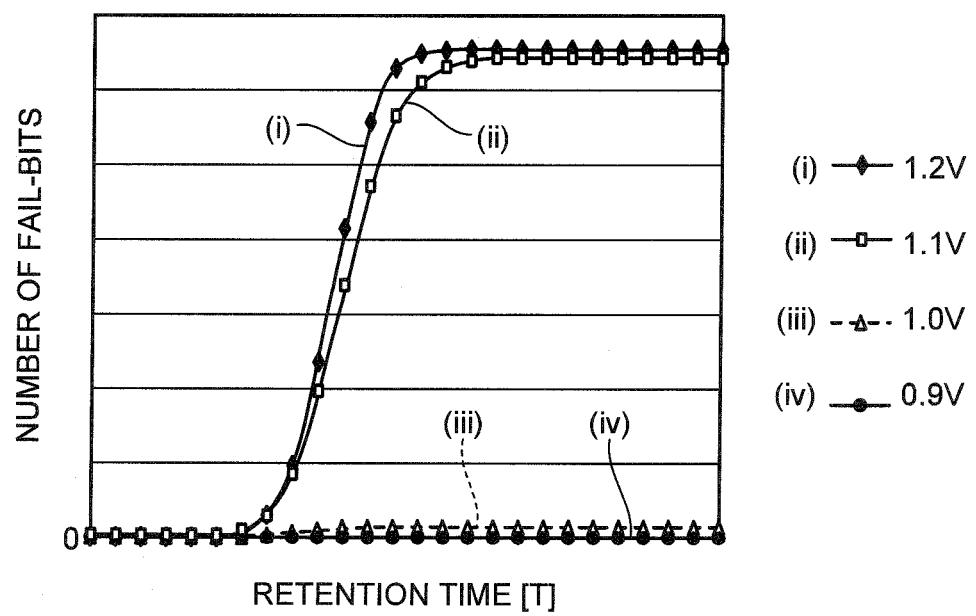
FIG. 3 is a view showing simulation results.

In the method of driving a semiconductor memory device according to this embodiment, the active state mode is set such that the voltage to be applied to the word line 10 is lowered by a predetermined voltage ΔV1 from the power supply voltage VDD, and the retention state mode is set such that the voltage to be applied to the word line 10 is returned to the power supply voltage VDD and the voltage VSC to be supplied to the sources of the NMOS transistors (23, 24) is raised by a predetermined voltage ΔV2 from the ground voltage VSS. Thus, both of the gate-source voltage and the source-substrate voltage of each of the NMOS transistors (23, 24) become negative, whereby the leakage currents of the NMOS transistors (23, 24) are reduced and thus the leakage currents can be suppressed. Consequently, it is possible to maintain a state where the leakage currents of the PMOS transistors (21, 22) are larger than the leakage currents of the NMOS transistors (23, 24), so that data retention can be achieved without performing a refreshing operation FIG. 3 is a view showing data retention characteristics in the active state mode. The horizontal axis denotes the data retention time (retention time), and the vertical axis denotes the number of fail-bits, i.e., the number of bits with their data retention states destroyed. FIG. 3 shows cases where the voltage at the source voltage supply end 25 of the memory cell 20 is fixed at the ground voltage VSS and the voltage of the word line 10 is changed. Specifically, the solid line (i) shows a case where the voltage of the word line 10 is set at 1.2V, the solid line (ii) shows a case where the voltage of the word line 10 is set at 1.1V, the broken line (iii) shows a case with 1.0V, and the solid line (iv) shows a case with 0.9V. When the voltage of the word line 10 is set at 0.9V, the number of fail-bits is drastically reduced.

In the active state mode, if the voltage of the word line 10 is slightly lowered from the power supply voltage VDD, the data retention characteristic in the active state mode is improved. This is so, because the word line 10 is supplied with a voltage lower than the power supply voltage VDD to increase the leakage currents of the PMOS transistors (21, 22) when the memory cell 20 is set in the non-selected state, it is possible to maintain a state where the leakage currents of the PMOS transistors (21, 22) are larger than the leakage currents of the NMOS transistors (23, 24).

Figure 4:
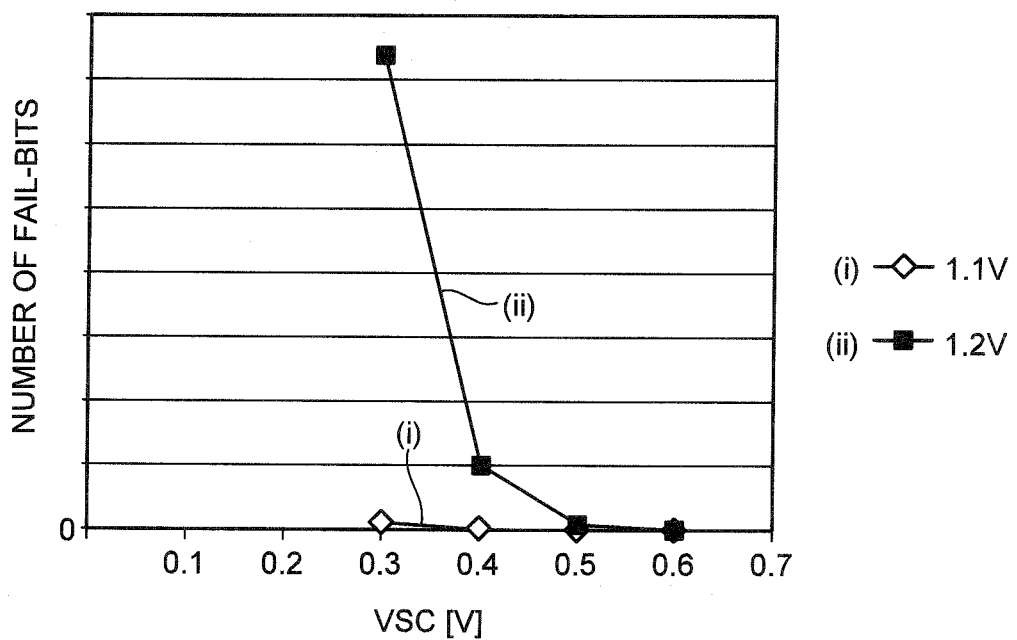
FIG. 4 is a view showing simulation results.

FIG. 4 is a view showing data retention characteristics in the retention state mode. The horizontal axis denotes the voltage VSC to be supplied to the source voltage supply end 25, and the vertical axis denotes the number of fail-bits. In FIG. 4, the solid line (i) shows a case where the voltage to be supplied to the word line 10 is set at 1.1V, and the solid line (ii) shows a case with 1.2V. In these cases, the power supply voltage VDD is set at 1.2V.

If the voltage of the word line 10 is raised to 1.2V equal to the power supply voltage VDD, the PMOS transistors (21, 22) are set in the OFF-state, and the NMOS transistors (23, 24) comprised in the memory cell 20 are supplied with the leakage currents of the PMOS transistors (21, 22). In other words, the memory cell 20 becomes a state to retain data by the leakage currents from the PMOS transistors (21, 22). Also in this case, the voltage at the source voltage supply end 25 is raised in the retention state mode to cause both of the gate-source voltage and the source-substrate voltage of each of the NMOS transistors (23, 24) to become negative, so that the leakage currents of the NMOS transistors (23, 24) are reduced and suppressed, whereby it is possible to maintain a state where the leakage currents of the PMOS transistors (21, 22) are larger than the leakage currents of the NMOS transistors (23, 24). For example, as in the case shown in solid line (ii) with the power supply voltage VDD set at 1.2V, if the source voltage supply end 25 is supplied with a voltage higher than the ground voltage VSS by about 0.5V to 0.6V, which is about a half of the power supply voltage VDD, the number of fail-bits is drastically reduced. On the other hand, in the case where the voltage of the word line 10 is set at 1.1V, if the voltage at the source voltage supply end 25 is raised only by about 0.3V, the number of fail-bits is drastically reduce. The voltage at the source voltage supply end 25 is raised, and the leakage currents can be thereby suppressed during data retention in the retention state mode, so that the power consumption can be reduced.

Third Embodiment

Figure 5:
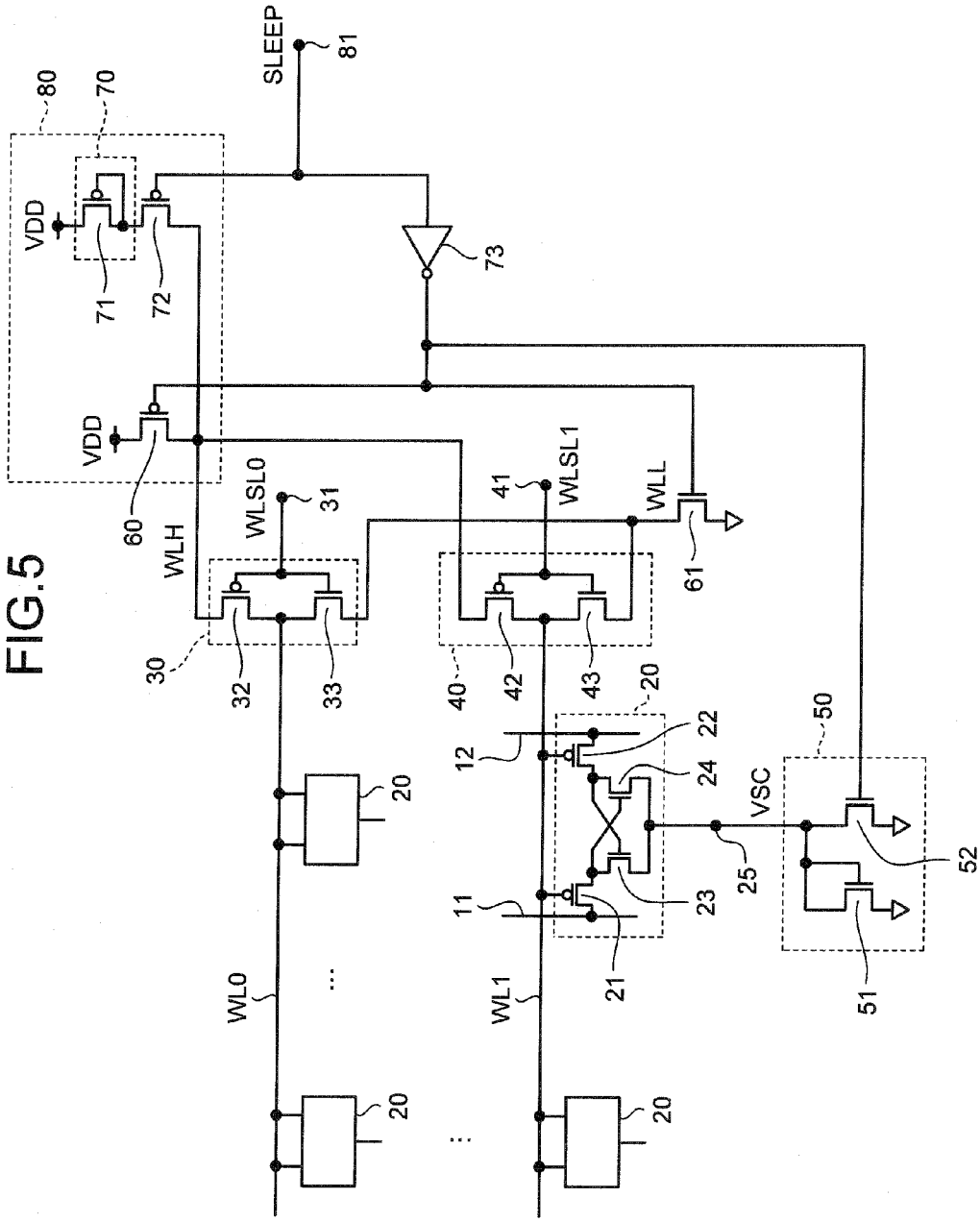
FIG. 5 is a view for explaining a configuration of a semiconductor memory device according to a third embodiment.

FIG. 5 is a view for explaining a configuration of a semiconductor memory device according to a third embodiment. The constituent elements corresponding to those of the embodiments described above are denoted by the same reference numerals, and their repetitive description will be made only when necessary. The word lines (WL0, WL1) are respectively provided with word line drive circuits (30, 40). The word line drive circuit 30 is composed of a CMOS inverter including a PMOS transistor 32 and an NMOS transistor 33. The word line drive circuit 40 is composed of a CMOS inverter including a PMOS transistor 42 and an NMOS transistor 43. The word line drive circuit 30 operates in response to a word line selection signal WLSL0 supplied to a selection terminal 31. The word line drive circuit 40 operates in response to a word line selection signal WLSL1 supplied to a selection terminal 41. The word line selection signals (WLSL0, WLSL1) are supplied from a decoder (not shown) separately arranged.

The source voltage supply end 25 of the memory cell 20 is supplied with an output VSC of the source voltage adjustment circuit 50. The source voltage adjustment circuit 50 includes an NMOS transistor 51 and an NMOS transistor 52. The drain and the gate of the NMOS transistor 51 are connected in common to form a diode. The source of the NMOS transistor 52 is grounded, and the gate of the NMOS transistor 52 is connected to the output end of an inverter 73. The drain of the NMOS transistor 52 is connected to the source voltage supply end 25.

The word line drive circuits (30, 40) are supplied with an output voltage WLH of the word line voltage adjustment circuit 80. The word line voltage adjustment circuit 80 includes a PMOS transistor 60. The source of the PMOS transistor 60 is supplied with the power supply voltage VDD. The gate of the PMOS transistor 60 is connected to the output end of an inverter 73. The word line voltage adjustment circuit 80 includes a voltage adjustment element 70 and a PMOS transistor 72. The voltage adjustment element 70 includes a PMOS transistor 71 that is in a diode-connection state. The source of the PMOS transistor 71 is supplied with the power supply voltage VDD. Since the voltage adjustment element 70 is composed of the PMOS transistor 71 in a diode-connection state, as a mere example, it may be configured in various structures to lower the power supply voltage VDD by a predetermined voltage.

A control terminal 81 is supplied with the mode switching signal SLEEP. In the retention state mode, the mode switching signal SLEEP becomes a High level. When the mode switching signal SLEEP is at the High level, a signal of a Low level is supplied from the inverter 73 to the PMOS transistor 60. Consequently, the PMOS transistor 60 is turned on, and so the voltage WLH to be supplied to the word line drive circuits (30, 40) becomes the power supply voltage VDD.

In the active state mode, the mode switching signal SLEEP becomes a Low level. Since the mode switching signal SLEEP of the Low level is supplied, the PMOS transistor 72 of the word line voltage adjustment circuit 80 is turned on, and so the word line voltage adjustment circuit 80 outputs a voltage obtained by adjusting the power supply voltage VDD in an amount corresponding to a voltage made by the voltage adjustment element 70. Consequently, the voltage WLH to be supplied to the word line drive circuits (30, 40) becomes a voltage lower by the voltage of the voltage adjustment element 70 than the power supply voltage VDD. Specifically, the voltage to be supplied is lowered by a voltage $\Delta V1$, as explained in the active state mode shown in FIG. 2.

The semiconductor memory device according to this embodiment comprises the word line voltage adjustment circuit 80 and the source voltage adjustment circuit 50. The source voltage adjustment circuit 50 supplies the source voltage supply end 25 with the ground voltage VSS in the active state mode, in response to the mode switching signal SLEEP applied to the control terminal 81. Further, the word line voltage adjustment circuit 80 supplies the word line drive circuit 30 with a voltage lowered by a predetermined voltage $\Delta V1$ from the power supply voltage VDD, in response to the mode switching signal SLEEP applied to the control terminal 81.

In the retention state mode, the mode switching signal SLEEP becomes the High level, and so a signal of a Low level is supplied from the inverter 73 to the gate of the NMOS transistor 52 of the source voltage adjustment circuit 50. Consequently, the NMOS transistor 52 is turned off, and so the source voltage supply end 25 is supplied with a voltage higher by the forward voltage of the diode-connected NMOS transistor 51 than the ground voltage VSS. For example, if the number of diode-connected NMOS transistors 51 is adjusted, it is possible to adjust the level of the voltage VSC to be supplied from the source voltage adjustment circuit 50 to the source voltage supply end 25 in the retention state mode. The power supply voltage VDD is supplied from the word line voltage adjustment circuit 80 to the word line drive circuits (30, 40). When the mode switching signal SLEEP is at the Low level, a signal of a High level is supplied from the inverter 73 to the gate of the NMOS transistor 61. Consequently, the NMOS transistor 61 is turned on, and so a voltage WLL of the ground voltage VSS is supplied to the sources of the NMOS transistors (33, 43) of the word line drive circuits (30, 40).

In this embodiment, the voltage WLH adjusted in accordance with the mode switching signal SLEEP is supplied to the word line drive circuit 30. Accordingly, the word line drive circuits (30, 40) operate in response to the word line selection signals (WLSL0, WLSL1), and the voltage WLH thereby adjusted is supplied to the word lines (WL0, WL1). Further, the voltage VSC adjusted in accordance with the mode switching signal SLEEP is supplied from the source voltage adjustment circuit 50 to the source voltage supply end 25 of each memory cell 20. Thus, the active state mode can be made to perform the control of enhancing the conduction of the PMOS transistors (21, 22) of the memory cell 20 to increase the leakage currents, and the retention state mode can be made to perform the control of reducing the leakage currents of the NMOS transistors (23, 24) comprised in the memory cell 20. Consequently, it is possible to maintain a state where the leakage currents of the PMOS transistors (21, 22) are larger than the leakage currents of the NMOS transistors (23, 24) in the memory cell 20, so that data retention can be achieved without performing a refreshing operation.

Fourth Embodiment

Figure 6:
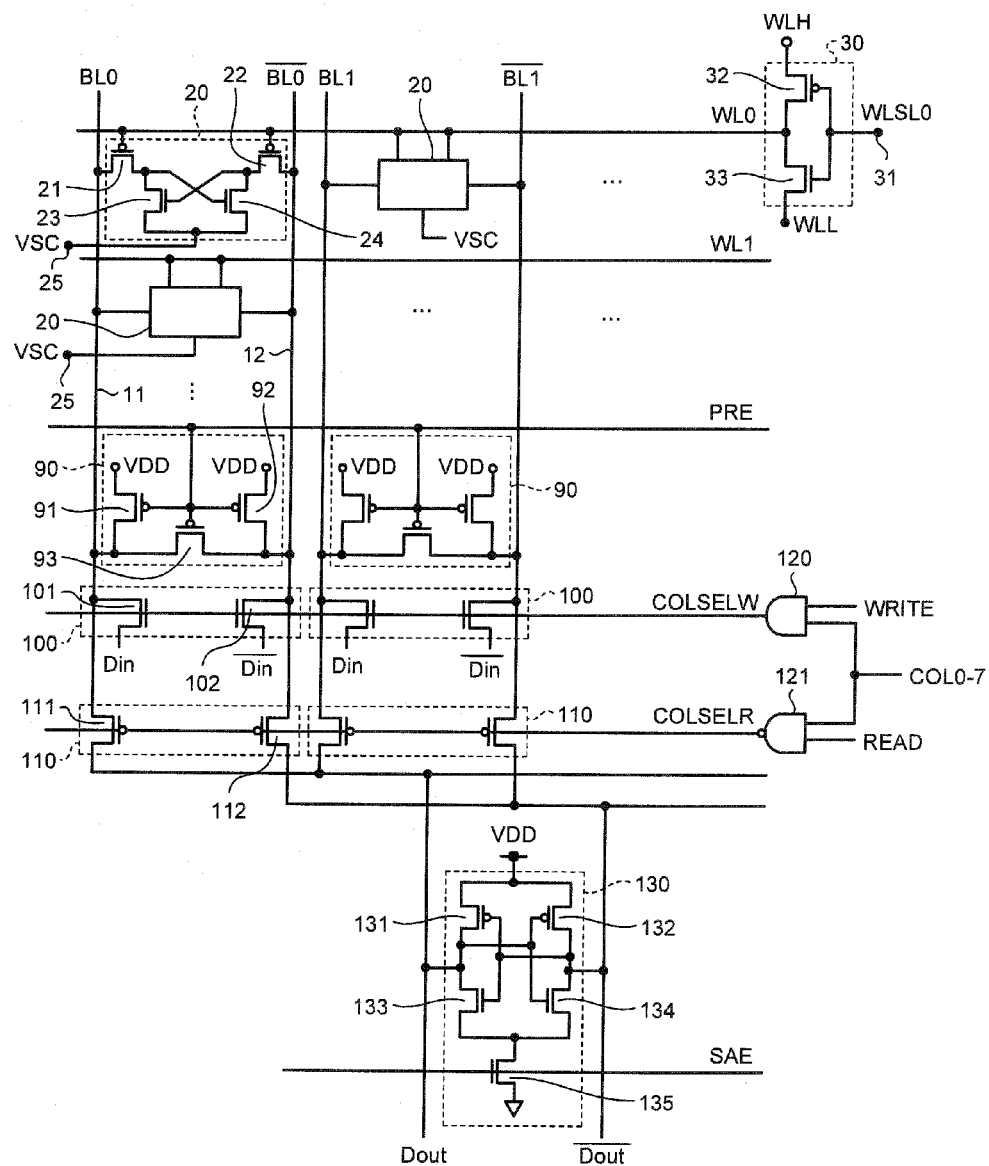
FIG. 6 is a view for explaining a configuration of a semiconductor memory device according to a fourth embodiment.

FIG. 6 is a view showing a configuration of a semiconductor memory device according to a fourth embodiment. The constituent elements corresponding to those of the embodiments described above are denoted by the same reference numerals, and their repetitive description will be made only when necessary. This embodiment shows one embodiment of a system configuration of a semiconductor memory device. This system configuration is the same as the system configuration of a conventional semiconductor memory device except that the word line drive circuit 30 and the source voltage supply end 25 of each memory cell 20 are supplied with voltages adjusted in accordance with the mode switching signal SLEEP. Specifically, the voltage WLH to be supplied to the source electrode of the PMOS transistor 32 of the word line drive circuit 30 is supplied from the word line voltage adjustment circuit 80 described above. When the mode switching signal SLEEP is at the High level, i.e., in the retention state mode, the power supply voltage VDD is applied as the voltage WLH. On the other hand, when the mode switching signal SLEEP is at the Low level, i.e., in the active state mode, a voltage lower by a predetermined voltage $\Delta V1$ than the power supply voltage VDD is applied. The word line drive circuit 30 operates in response to the word line selection signal WLSL0, such that, when the PMOS transistor 32 of the word line drive circuit 30 is turned on, the voltage WLH is supplied to the word line WL0.

The source voltage supply end 25 of each memory cell 20 is supplied with the voltage VSC from the source voltage adjustment circuit 50 described above. Specifically, when the mode switching signal SLEEP is at the High level, i.e., in the retention state mode, the ground voltage VSS is applied. On the other hand, when the mode switching signal SLEEP is at the Low level, i.e., in the active state mode, a voltage higher by a predetermined voltage $\Delta V2$ than the ground voltage VSS is applied.

A pre-charge equalizer circuit 90 is provided between each pair of bit lines (BL0, /BL0, BL1, /BL1). The pre-charge equalizer circuit 90 operates in response to a pre-charge equalizing control signal PRE. The pre-charge equalizer circuit 90 includes three PMOS transistors (91, 92, 93).

A write circuit 100 is connected between each pair of bit lines (BL0, /BL0, BL1, /BL1). The write circuit 100 operates in response to a write signal COLSELW supplied form an AND gate 120. The write circuit 100 includes two NMOS transistors (101, 102). The gates of the NMOS transistors (101, 102) connected in common are supplied with the write signal COLSELW, and their sources are supplied with data (Din, /Din). The AND gate 120 generates the write signal COLSELW in response to a column selection signal COL0-7 and a write control signal WRITE. The column selection signal COL0-7 is supplied from a decoder (not shown) separately arranged.

A read circuit 110 is provided between each pair of bit lines (BL0, /BL0, BL1, /BL1). The read circuit 110 operates in response to a read signal COLSELR supplied from a gate circuit 121. The read circuit 110 includes two PMOS transistors (111, 112) connected between a sense amplifier 130 and the bit lines (BL0, /BL0). The gate circuit 121 generates the read signal COLSELR in response to the column selection signal COL0-7 and a read control signal READ. The read circuit 110 connects the bit lines (BL0, /BL0) to the sense amplifier 130 in response to the read signal COLSELR.

The sense amplifier 130 amplifies the voltage difference between the bit lines (BL0, /BL0) and outputs output signals (Dout, /Dout). The sense amplifier 130 includes two PMOS transistors (131, 132) and two NMOS transistors (133, 134). The PMOS transistor 131 and the NMOS transistor 133 form a CMOS inverter. Similarly, the PMOS transistor 132 and the NMOS transistor 134 form a CMOS inverter. The sources of the NMOS transistors (133, 134) are connected to the drain of an NMOS transistor 135. The source of the NMOS transistor 135 is grounded. The ON/OFF of the NMOS transistor 135 is controlled by a sense amplifier control signal SAE supplied to the gate of the NMOS transistor 135, so that the sense amplifier 130 is controlled.

As described above, in accordance with the mode switching signal SLEEP, the word line drive circuit 30 is supplied with the power supply voltage VDD in the retention state mode. Further, it is supplied with a voltage lowered by a predetermined voltage from the power supply voltage VDD in the active state mode. Further, in accordance with the mode switching signal SLEEP, the source voltage supply end 25 of the memory cell 20 is supplied with a voltage higher by a predetermined voltage than the ground voltage VSS in the retention state mode, and it is supplied with the ground voltage VSS in the active state mode.

In this embodiment, the voltage WLH adjusted in accordance with the mode switching signal SLEEP is supplied from the word line voltage adjustment circuit 80 to the word line drive circuit 30. The word line drive circuit 30 operates in accordance with the word line selection signal WLSL0 supplied from a decoder (not shown) separately arranged, so that the voltage WLH thus adjusted is supplied to the word line WL0 in accordance with the mode switching signal SLEEP. Accordingly, the active state mode can be made to perform the control of increasing the leakage currents of the PMOS transistors (21, 22) of the memory cell 20, and the retention state mode can be made to perform the control of reducing the leakage currents of the NMOS transistors (23, 24) comprised in the memory cell 20. Consequently, it is possible to maintain a state where the leakage currents of the PMOS transistors (21, 22) are larger than the leakage currents of the NMOS transistors (23, 24) in the memory cell 20, so that data retention can be achieved without performing a refreshing operation.

Fifth Embodiment

Figure 7:
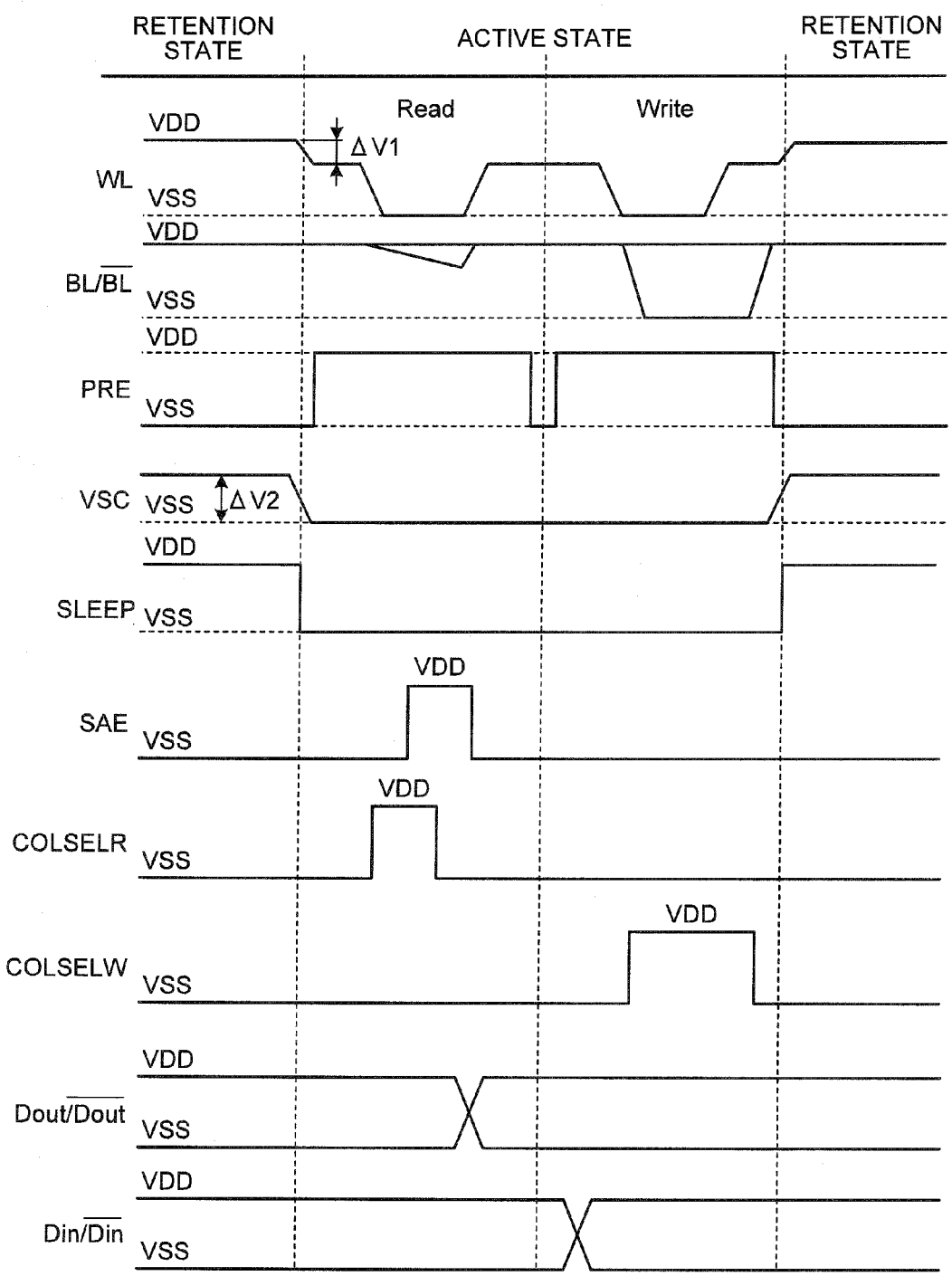
FIG. 7 is a view for explaining a method of driving a semiconductor memory device according to a fifth embodiment.

FIG. 7 is a view showing a timing chart of a method of driving a semiconductor memory device according to a fifth embodiment. In this embodiment, an explain will be given of a method of driving the semiconductor memory device according to the fourth embodiment shown in FIG. 6, as an example. In the retention state mode, i.e., when the mode switching signal SLEEP is at the High level, the word line WL is supplied with the power supply voltage VDD. The bit lines (BL, /BL) are set at the power supply voltage VDD or the ground voltage VSS in accordance with the retained data. The voltage VSC supplied to the source voltage supply end 25 is set at a voltage higher by $\Delta V2$ than the ground voltage VSS. This is conceived to suppress the leakage currents of the NMOS transistors (23, 24) comprised in the memory cell 20 in the retention state mode, as described above.

In the active state mode, i.e., when the mode switching signal SLEEP is at the Low level, the pre-charge equalizing control signal PRE becomes a High level in accordance with the timing of read "Read" or write "Write". In the read "Read", the sense amplifier control signal SAE becomes a High level, and the read circuit 110 operates in accordance with the COLSELR output from the AND gate 121, so that data is read by the sense amplifier 130 and the data is output (Dout, /Dout). In the write "Write", the COLSELW output from the AND gate 12 becomes a High level, so that the data (Din, /Din) is written into the corresponding memory cell 20.

In this embodiment, in accordance with the retention state mode and the active state mode, the voltage to be supplied to the word line WL and the voltage to be applied to the source voltage supply end 25 of the memory cell 20 are adjusted and then supplied. Specifically, in the active state mode, a voltage slightly lower than the power supply voltage VDD is supplied to the word line WL to perform the control of increasing the leakage currents from the PMOS transistors (21, 22) of the memory cell 20. On the other hand, in the retention state mode, the voltage VSC at the source voltage supply end 25 of the memory cell 20 is raised by a predetermined voltage from the ground voltage VSS. With this operation, the leakage currents of the NMOS transistors (23, 24) comprised in the memory cell 20 are suppressed. Consequently, even when the PMOS transistors (21, 22) are turned off and thereby bring about a state of data retention using leakage currents, the state can be controlled such that the leakage currents of the NMOS transistors (23, 24) are smaller than the leakage currents of the PMOS transistors (21, 22), so that data retention can be achieved without performing a refreshing operation.

Sixth Embodiment

Figure 8:
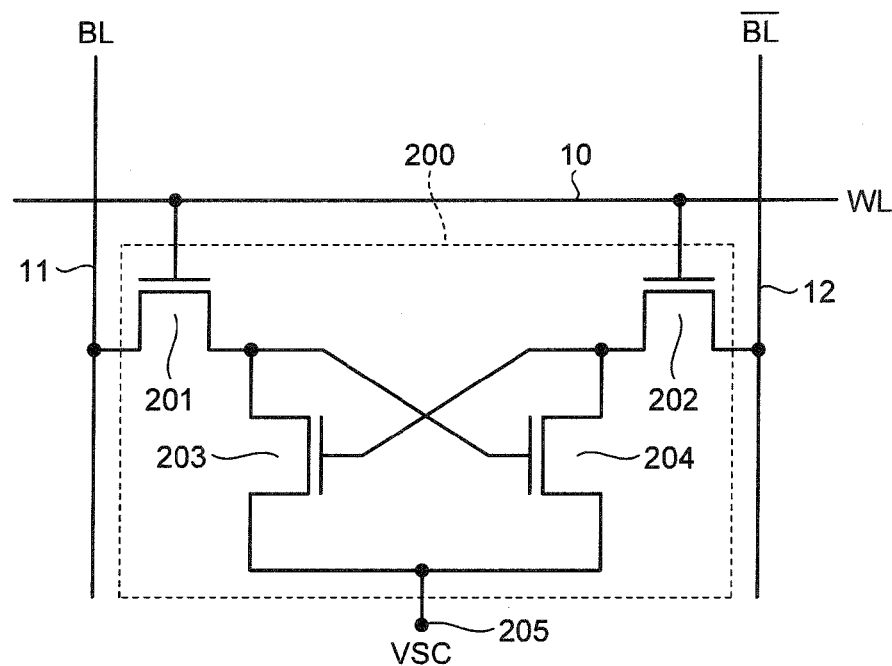
FIG. 8 is a view for explaining a configuration of a memory cell of a semiconductor memory device according to a sixth embodiment.

FIG. 8 is a view showing a configuration of an SRAM memory cell 200 composed of four MOS transistors according to another embodiment. In the memory cell 200 according to this embodiment, MOS transistors (201, 201) connected to the bit lines (11, 12) are respectively formed of NMOS transistors. Accordingly, when the voltage of the word line 10 is the power supply voltage VDD, the memory cell 200 is set in the selected state, and, when the voltage of the word line 10 is the ground voltage VSS, the memory cell 200 is set in the non-selected state.

In the case where the memory cell 200 according to this embodiment is used, when the memory cell 200 is set in the non-selected state in the active state mode, i.e., when the NMOS transistors (201, 202) are set in the OFF-state, the word line voltage adjustment circuit 80 supplies the word line 10 with a voltage higher by a predetermined voltage than the ground voltage VSS. Consequently, it is possible to maintain a state where the leakage currents of the NMOS transistors (201, 202) are larger than the leakage currents of NMOS transistors (203, 204), so that data retention can be achieved without performing a refreshing operation.

In order to design a configuration where the leakage currents of the NMOS transistors (201, 202) connected to the bit lines (11, 12) are larger than the leakage currents of the NMOS transistors (203, 204) including sources connected to a source voltage supply end 205, for example, the threshold voltage VTH of each of the NMOS transistors (201, 202) is set smaller than the threshold voltage VTH of each of the NMOS transistors (203, 204). Alternatively, the gate length of each of the NMOS transistors (201, 202) is set smaller than the gate length of each of the NMOS transistors (203, 204). Further, the gate width of each of the NMOS transistors (201, 202) is set larger than the gate width of each of the NMOS transistors (203, 204).

Seventh Embodiment

Figure 9:
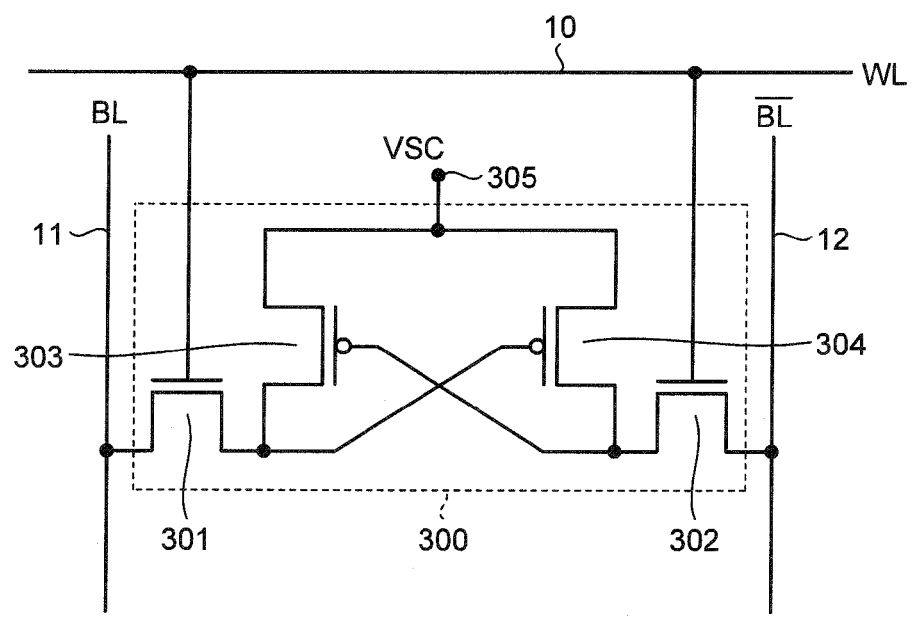
FIG. 9 is a view for explaining a configuration of a memory cell of a semiconductor memory device according to a seventh embodiment.

FIG. 9 is a view showing a configuration of an SRAM memory cell 300 composed of four MOS transistors according to another embodiment. The SRAM memory cell 300 according to this embodiment differs in polarity from the MOS transistors comprised in the memory cell 20 described above. Specifically, MOS transistors (303, 304) including sources connected in common are respectively formed of PMOS transistors, and MOS transistors (301, 302) connected to the bit lines (11, 12) are respectively formed of NMOS transistors. In the case of the memory cell 300 according to this embodiment, the relationship of voltages is opposite to that of the embodiments using the memory cell 20 described above. Specifically, in the active state mode, when the voltage of the word line 10 is at a High level, the memory cell 300 is set in the selected state, and when the voltage of the word line 10 is at a Low level, the memory cell 300 is set in the non-selected state.

Accordingly, the relationship of voltages to be supplied to the memory cell 300 is set opposite to that of the embodiments using the memory cell 20 described above, so that the active state mode and the retention state mode can be controlled to be in a state where the leakage currents of the NMOS transistors (301, 302) are larger than the leakage currents of the PMOS transistors (303, 304). Specifically, in the active state mode, the word line voltage adjustment circuit 80 supplies a source voltage supply end 305 with a voltage obtained by raising the voltage of the word line 10 by a predetermined voltage from the ground voltage VSS. In the retention state mode, the voltage VSC at the source voltage supply end 305 is lowered by a predetermined voltage from the power supply voltage VDD. Consequently, it is possible to maintain a state where the leakage currents of the NMOS transistors (301, 302) are larger than the leakage currents of the PMOS transistors (303, 304), so that data retention can be achieved without performing a refreshing operation.

In order to design a configuration where the leakage currents of the NMOS transistors (301, 302) connected to the bit lines (11, 12) are larger than the leakage currents of the PMOS transistors (303, 304) including sources connected to a source voltage supply end 305, for example, the threshold voltage VTH of each of the NMOS transistors (301, 302) is set smaller than the threshold voltage VTH of each of the PMOS transistors (303, 304). Alternatively, the gate length of each of the NMOS transistors (301, 302) is set smaller than the gate length of each of the PMOS transistors (303, 304). Further, the gate width of each of the NMOS transistors (301, 302) is set larger than the gate width of each of the PMOS transistors (303, 304).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first MOS transistor including a source, a drain, and a gate, such that its source is connected to a first bit line and its gate is connected to a word line;
a second MOS transistor including a source, a drain, and a gate, such that its source is connected to a second bit line and its gate is connected to the word line;
a third MOS transistor including a source, a drain, and a gate, such that its source is connected to a source voltage supply end, its gate is connected to the drain of the second MOS transistor, and its drain is connected to the drain of the first MOS transistor;
a fourth MOS transistor including a source, a drain, and a gate, such that its source is connected to the source voltage supply end, its gate is connected to the drain of the first MOS transistor, and its drain is connected to the drain of the second MOS transistor;
a source voltage adjustment circuit configured to supply first and second voltages to the source voltage supply end in a switching manner, wherein the second voltage is a voltage for reducing leakage currents of the third MOS transistor and the fourth MOS transistor as compared with the first voltage and has been obtained by adjusting the first voltage by a predetermined voltage, and wherein the source voltage adjustment circuit supplies the first voltage to the source voltage supply end in an active state mode where read or write of data is performed and supplies the second voltage to the source voltage supply end in a retention state mode where data retention is performed in response to a mode switching signal for switching between the retention state mode and the active state mode;

a word line voltage adjustment circuit configured to supply in a switching manner to the word line between a third voltage at the retention state mode and a fourth voltage at the active state mode, wherein the fourth voltage is a voltage for increasing leakage currents of the first and second MOS transistors as compared with the third voltage and has been obtained by adjusting the third voltage by a predetermined voltage, in response to the mode switching signal; and a word line drive circuit configured to drive the word line to perform the read or write of data in the active state mode in responsive to a word line selection signal, wherein the word line drive circuit supplies a fifth voltage to the word line to turn on the first and second MOS transistors when the word line is selected by the word line selection signal in the active state mode.

2. The semiconductor memory device according to claim 1, wherein the third MOS transistor and the fourth MOS transistor are NMOS transistors, the first voltage is a ground voltage, and the second voltage is a voltage higher by a predetermined voltage than the ground voltage.

3. The semiconductor memory device according to claim 1, wherein
the word line voltage adjustment circuit supplies a higher voltage of the third voltage and the fourth voltage to the word line in the case where the source voltage adjustment circuit supplies a higher voltage of the first voltage and the second voltage in response to switching to the retention state mode by the mode switching signal, and
the word line voltage adjustment circuit supplies a lower voltage of the third voltage and the fourth voltage to the word line in the case where the source voltage adjustment circuit supplies a lower voltage of the first voltage and the second voltage in response to switching to the active state mode by the mode switching signal.

4. The semiconductor memory device according to claim 1, wherein the third voltage is a power supply voltage on a higher voltage side, and the second voltage is a voltage higher by a predetermined voltage than a ground voltage.

5. The semiconductor memory device according to claim 1, wherein the first MOS transistor and the second MOS transistor are PMOS transistors, the third voltage is a power supply voltage on a higher voltage side, and the fourth voltage is a voltage lower by a predetermined voltage than the power supply voltage.

6. The semiconductor memory device according to claim 5, wherein the word line drive circuit supplies a ground voltage to the word line as the fifth voltage.

7. The semiconductor memory device according to claim 1, wherein
a threshold voltage of the first MOS transistor is smaller than a threshold voltage of the third MOS transistor, and a threshold voltage of the second MOS transistor is smaller than a threshold voltage of the fourth MOS transistor.

8. The semiconductor memory device according to claim 1, wherein
a gate length of the first MOS transistor is smaller than a gate length of the third MOS transistor, and
a gate length of the second MOS transistor is smaller than a gate length of the fourth MOS transistor.

9. The semiconductor memory device according to claim 1, wherein
a gate width of the first MOS transistor is larger than a gate width of the third MOS transistor, and
a gate width of the second MOS transistor is larger than a gate width of the fourth MOS transistor.

10. The semiconductor memory device according to claim 1, wherein the fourth voltage is a voltage to keep the first and second MOS transistors in OFF-state.

11. A method of driving a semiconductor memory device comprising memory cells,
each of the memory cells comprising:
a first MOS transistor including a source, a drain, and a gate, such that its source is connected to a first bit line and its gate is connected to a word line;
a second MOS transistor including a source, a drain, and a gate, such that its source is connected to a second bit line and its gate is connected to the word line;
a third MOS transistor including a source, a drain, and a gate, such that its source is connected to a source voltage supply end, its gate is connected to the drain of the second MOS transistor, and its drain is connected to the drain of the first MOS transistor; and
a fourth MOS transistor including a source, a drain, and a gate, such that its source is connected to the source voltage supply end, its gate is connected to the drain of the first MOS transistor, and its drain is connected to the drain of the second MOS transistor,
the method comprising:
providing a mode switching signal for switching between a retention state mode where data retention is performed and an active state mode where read or write of data is performed;
providing a word line selection signal to select the word line to perform the read or write of data in the active state mode;
supplying to the source voltage supply end a first voltage in the active state mode and a second voltage in the retention state mode, wherein the second voltage is a voltage for reducing leakage currents of the third MOS transistor and the fourth MOS transistor as compared with the first voltage, in response to the mode switching signal;
supplying to the word line a third voltage in the retention state mode in response to the mode switching signal;
supplying to the word line a fourth voltage when the word line is not selected by the word line selection signal in the active state mode, wherein the fourth voltage is a voltage to maintain the first MOS transistor and the second MOS transistor in OFF-state and for increasing leakage currents of the first MOS transistor and the second MOS transistor as compared with the third voltage, in response to the mode switching signal; and
supplying to the word line a fifth voltage to turn on the first MOS transistor and the second MOS transistor when the word line is selected by the word line selection signal in the active state mode.

12. The method of driving a semiconductor memory device according to claim 11, wherein the third MOS transistor and the fourth MOS transistor are respectively formed of NMOS transistors, and the method comprises: supplying the source voltage supply end with a ground voltage as the first voltage in the active state mode; and supplying the source voltage supply end with a voltage higher by a predetermined voltage than the ground voltage as the second voltage, in response to the mode switching signal.

13. The method of driving a semiconductor memory device according to claim 11, wherein the first MOS transistor and the second MOS transistor are respectively formed of PMOS transistors, and the method comprises: supplying the word line with a power supply voltage on a higher voltage side in the retention state mode as the third voltage; and supplying the word line with a voltage lower by a predetermined voltage than the power supply voltage on the higher voltage side in the active state mode as the fourth voltage.

14. A semiconductor memory device comprising memory cells, each of the memory cells comprising:
   a first MOS transistor including a source, a drain, and a gate, such that its source is connected to a first bit line and its gate is connected to a word line;
   a second MOS transistor including a source, a drain, and a gate, such that its source is connected to a second bit line and its gate is connected to the word line;
   a third MOS transistor including a source, a drain, and a gate, such that its source is connected to a source voltage supply end, its gate is connected to the drain of the second MOS transistor, and its drain is connected to the drain of the first MOS transistor; and
   a fourth MOS transistor including a source, a drain, and a gate, such that its source is connected to the source voltage supply end, its gate is connected to the drain of the first MOS transistor, and its drain is connected to the drain of the second MOS transistor, wherein the first MOS transistor is formed of a MOS transistor having a leakage current larger than that of the third MOS transistor, and the second MOS transistor is formed of a MOS transistors having a leakage current larger than that of the fourth MOS transistor, the semiconductor memory device comprising:
   a source voltage adjustment circuit configured to supply first and second voltages to the source voltage supply end in a switching manner, wherein the second voltage is a voltage for reducing leakage currents of the third MOS transistor and the fourth MOS transistor as compared with the first voltage and has been obtained by adjusting the first voltage by a predetermined voltage, and wherein the source voltage adjustment circuit supplies the first voltage to the source voltage supply end in an active state mode where read or write of data is performed and supplies the second voltage to the source voltage supply end in a retention state mode where data retention is performed in response to a mode switching signal for switching between the retention state mode and the active state mode;
   a word line voltage adjustment circuit configured to output a third voltage in the retention state mode and a fourth voltage in the active state mode in a switching manner as an output voltage, wherein the fourth voltage is a voltage for increasing leakage currents of the first MOS transistor and the second MOS transistor as compared with the third voltage and has been obtained by adjusting the third voltage by a predetermined voltage, in response to the mode switching signal; and
   a word line drive circuit configured to drive the word line to perform the read or write of data in the active state mode in responsive to a word line selection signal, wherein the word line drive circuit is biased with a fifth voltage and the output voltage of the word line voltage adjustment circuit, and the word line drive circuit supplies the fifth voltage to the word line to turn on the first MOS transistor and the second MOS transistor when the word line is selected by the word line selection signal and supplies the output voltage of the word line adjusting circuit to the word line when the word line is not selected by the word line selection signal.

15. The semiconductor memory device according to claim 14, wherein
   the first and second MOS transistors are PMOS transistors, and
   the fifth voltage is a ground voltage.

* * * * *